United States Patent
Leong et al.

(10) Patent No.: US 10,636,749 B2
(45) Date of Patent: Apr. 28, 2020

(54) SEMICONDUCTOR PACKAGE SUBSTRATE SUPPORT STRUCTURES FOR BALL-GRID ARRAY CAVITIES, AND METHODS OF ASSEMBLING SAME

(71) Applicant: Intel Corporation, Santa Clara, CA (US)

(72) Inventors: Kean Huat Leong, Georgetown (MY); Chun Kit See, Bayan Lepas (MY); Sheng Jian Darren Tan, Penang (MY); Paik Wen Ong, Taiping (MY); Eng Huat Goh, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/018,940

(22) Filed: Jun. 26, 2018

(65) Prior Publication Data
US 2019/0148310 A1 May 16, 2019

(30) Foreign Application Priority Data
Nov. 14, 2017 (MY) .......................... PI 2017704317

(51) Int. Cl.
*H01L 23/00* (2006.01)
*H01L 23/498* (2006.01)
*H01L 21/48* (2006.01)

(52) U.S. Cl.
CPC ........ *H01L 23/562* (2013.01); *H01L 21/4853* (2013.01); *H01L 23/49816* (2013.01); *H01L 23/49838* (2013.01); *H01L 24/16* (2013.01); *H01L 2224/16225* (2013.01); *H01L 2224/16227* (2013.01); *H01L 2924/00014* (2013.01); *H01L 2924/1432* (2013.01); *H01L 2924/15311* (2013.01); *H01L 2924/19106* (2013.01); *H01L 2924/3511* (2013.01)

(58) Field of Classification Search
CPC ........... H01L 21/4853; H01L 23/49816; H01L 23/49838; H01L 23/562; H01L 24/16; H01L 2924/15311
See application file for complete search history.

(56) References Cited

U.S. PATENT DOCUMENTS

| | | | | |
|---|---|---|---|---|
| 5,901,041 A * | 5/1999 | Davies | ............... | H01L 23/3107 361/704 |
| 6,034,427 A * | 3/2000 | Lan | ..................... | H01L 23/3128 257/698 |
| 6,078,506 A * | 6/2000 | Sugahara | ............... | H01L 23/16 257/704 |
| 6,184,580 B1 * | 2/2001 | Lin | ..................... | H01L 23/3128 257/706 |
| 6,631,078 B2 * | 10/2003 | Alcoe | ................. | H01L 23/3737 257/719 |
| 6,879,039 B2 * | 4/2005 | Khan | ..................... | H01L 23/13 257/678 |

(Continued)

*Primary Examiner* — Allan R Wilson
(74) *Attorney, Agent, or Firm* — Schwegman Lundberg & Woessner, P.A.

(57) ABSTRACT

A semiconductor package substrate has a cavity on the land side among the ball-grid array, and a support structure inserted into the cavity as well as covering at least one device that is seated on the land side. The cavity is an enclave or an exclave. The support structure takes on several useful compositions as well as shapes and sizes.

18 Claims, 13 Drawing Sheets

(56) References Cited

U.S. PATENT DOCUMENTS

| | | | | |
|---|---|---|---|---|
| 2002/0153604 | A1* | 10/2002 | Vaiyapuri | H01L 23/3114 257/686 |
| 2008/0251906 | A1* | 10/2008 | Eaton | H01L 23/576 257/686 |
| 2012/0020040 | A1* | 1/2012 | Lin | H01L 25/0652 361/772 |
| 2018/0226361 | A1* | 8/2018 | Chen | H01L 23/562 |

\* cited by examiner

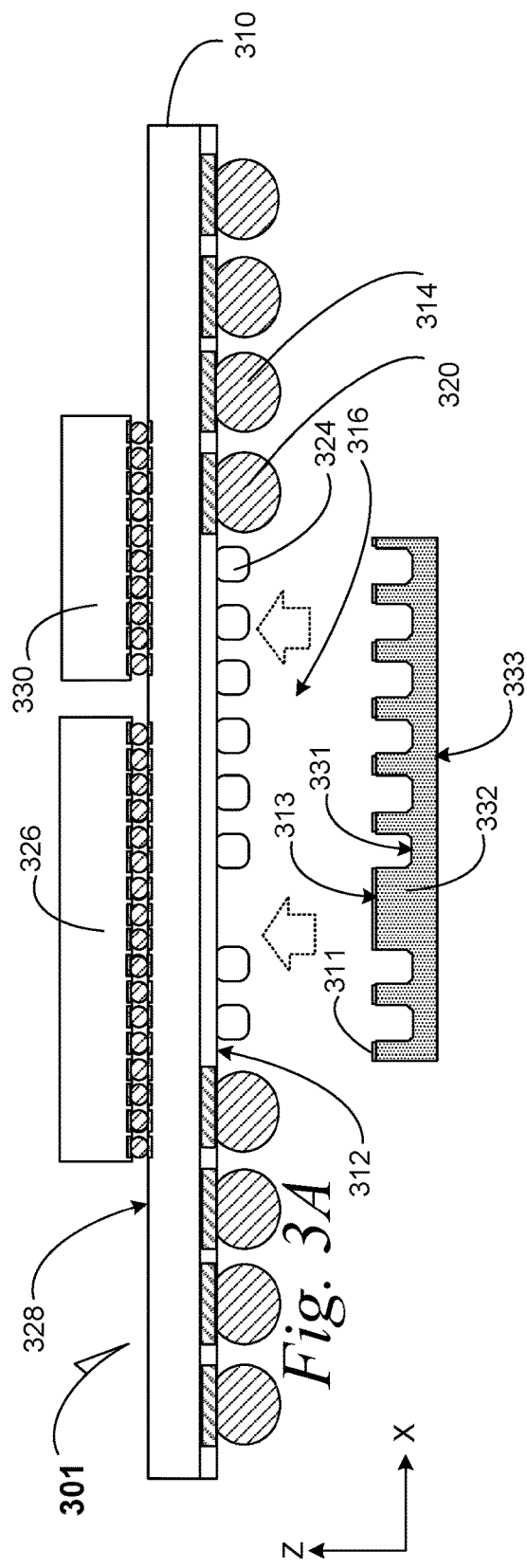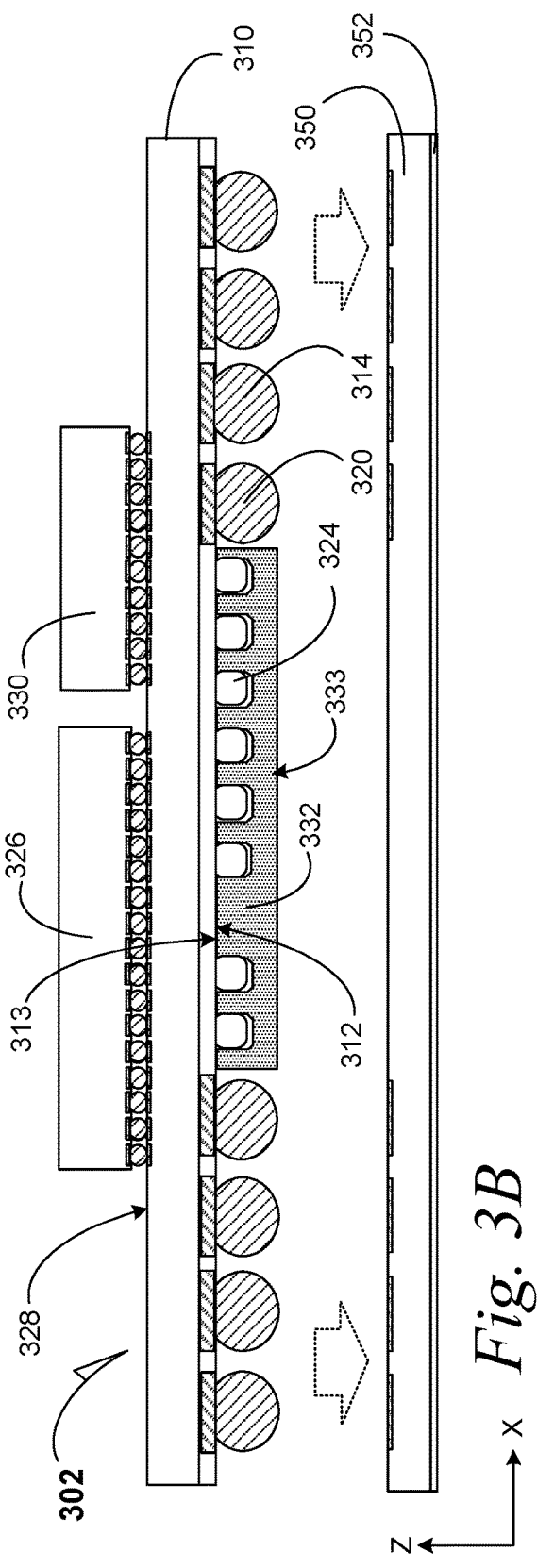

US 10,636,749 B2

SEMICONDUCTOR PACKAGE SUBSTRATE SUPPORT STRUCTURES FOR BALL-GRID ARRAY CAVITIES, AND METHODS OF ASSEMBLING SAME

PRIORITY APPLICATION

This application claims the benefit of priority to Malaysian Application Serial Number PI 2017704317, filed Nov. 14, 2017, which is incorporated herein by reference in its entirety.

FIELD

This disclosure relates ball grid arrays on semiconductor package substrates and structures that resist both thermal and physical loading warpage effects.

BACKGROUND

Semiconductor package substrates experience both physical and thermal loads that may cause warping of the substrates. Warping may cause electrical connections to fail.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 3A is a cross-section elevation of a semiconductor package substrate that carries at least one device mounted on the land side of the package substrate according to an embodiment;

FIG. 3B is a cross-section elevation of the semiconductor package substrate depicted in FIG. 3A after further assembly according to an embodiment;

DETAILED DESCRIPTION

Electrical and electronic components can be placed on a semiconductor package substrate, on the land side. The components are placed within a cavity region that is among the land side electrical bumps. Upon assembly to a board such as a printed wiring board, the cavity region creates a gap between the package land side and board surface. Disclosed embodiments complement the cavity region with a support structure to resist both thermal and physical stresses within the semiconductor package substrate. The support structure allows for higher throughput yield during assembly such that the number of redundant bumps is reduced.

In an embodiment, support structures are located within a central cavity, or enclave region of a semiconductor package substrate. In an embodiment, support structures are located at a peripheral cavity or exclave region, of a semiconductor package substrate. Although a higher current density may be required when placing devices on the semiconductor package substrate land side, the support structure embodiments increase ball grid array reliability.

Support structure embodiments reduce tendencies for semiconductor package substrates from warping as the cavity region is complemented and at least partially filled as solid support structures bridge between the package substrate land side and the board.

The support structure embodiments are placed at the land side of the package substrate within the cavity region that is centrally located, or enclave region located in an embodiment. The support structure embodiments are placed at the land side within a peripheral cavity region, or exclave region located on the semiconductor package substrate in an embodiment. The support structure embodiments are placed intermingled within electrical bumps of the ball grid array in an embodiment. Support structure embodiments vary in form and shape depending upon a useful application within a semiconductor package substrate. Support structure embodiments vary in chemical and physical components depending upon a useful application within a semiconductor package substrate.

Figure 1:
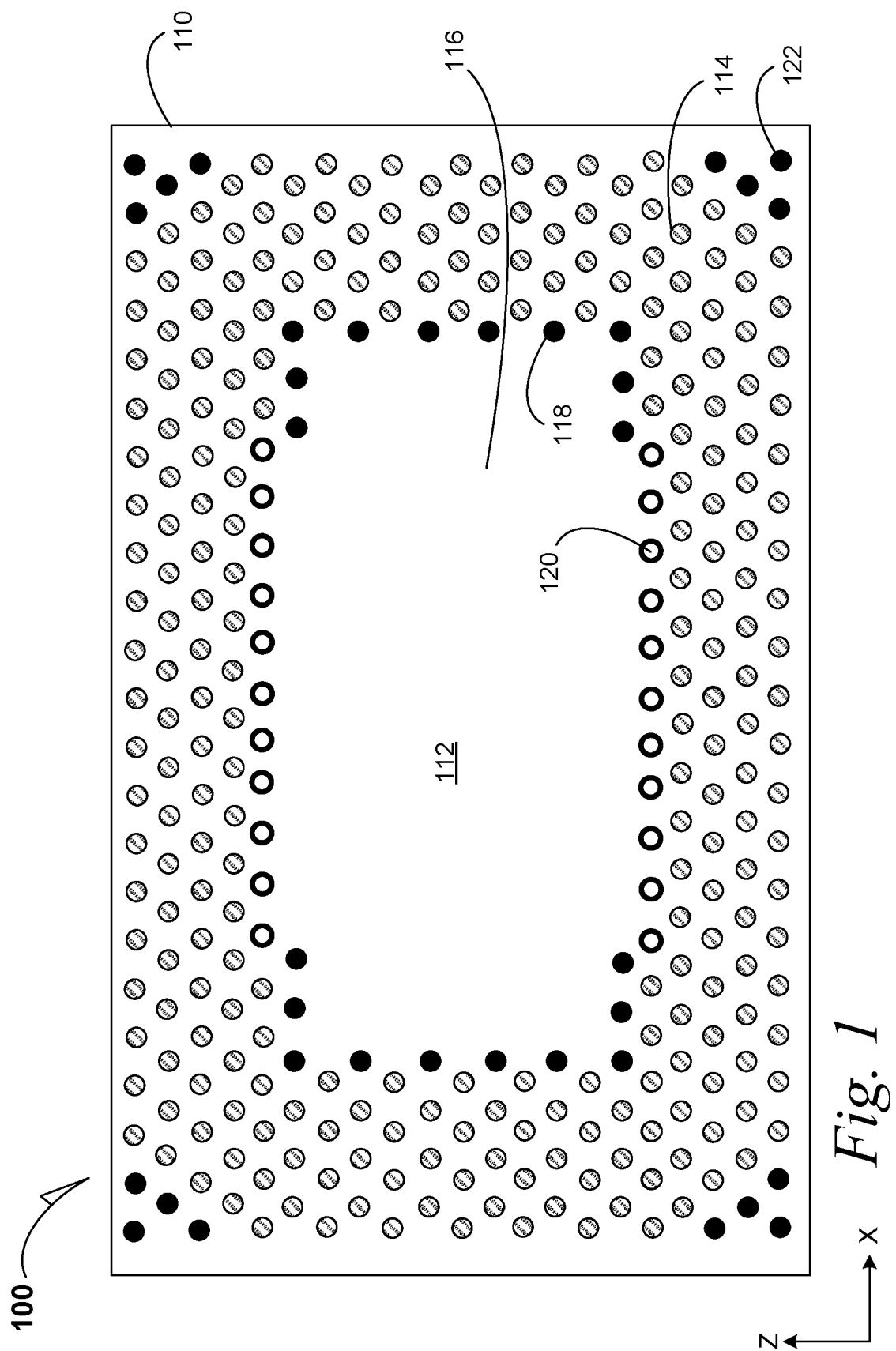
FIG. 1 is a bottom plan of a semiconductor package substrate according to an embodiment.

FIG. 1 is a bottom plan 100 of a semiconductor package substrate 110 according to an embodiment. A land side surface 112 of the semiconductor package substrate 110 includes a ball grid array, one exemplary electrical bump of which is indicated with reference number 114. A cavity region 116 is located centrally, or an enclave region, among the several electrical bumps 114. On the periphery and X-direction ends of the cavity region 116 are cavity peripheral bumps, an exemplary electrical bump of which is depicted in solid and with reference number 118. On the periphery and Y-direction ends of the cavity region 116 are cavity peripheral bumps, an exemplary electrical bump of which is depicted in heavy-line open with reference number 120. On the corners of the land side surface 112 of the semiconductor package substrate 110 are several corner bumps, an exemplary bump of which is depicted in solid with reference number 122.

The ball-grid array is depicted in body-centered hexagonal (seven bumps), but any useful bump packing arrangement may be used with a cavity region depending upon a given application. The several bumps of the ball-grid array 114 generally, and peripheral 118 and 120 as well as corner 122 bumps have different uses and experience different stresses when deployed as part of a semiconductor package.

The several bumps 114 generally serve for power, ground and input-output (I/O) as useful for a given application. In an embodiment, the cavity peripheral bumps 118 are primarily for structural integrity such that if they physically fracture, or some of them, they are sufficiently redundant that systemic failure likelihood is reduced. In an embodiment, the corner bumps 122 are primarily for structural integrity at the corners such that if they physically fracture, or some of them, they are sufficiently redundant that systemic failure likelihood is reduced. In an embodiment, the peripheral bumps 118 are primarily for structural integrity such that if they physically fracture, or some of them, they are sufficiently non-power/ground/I/O that systemic failure likelihood is reduced.

Figure 2:
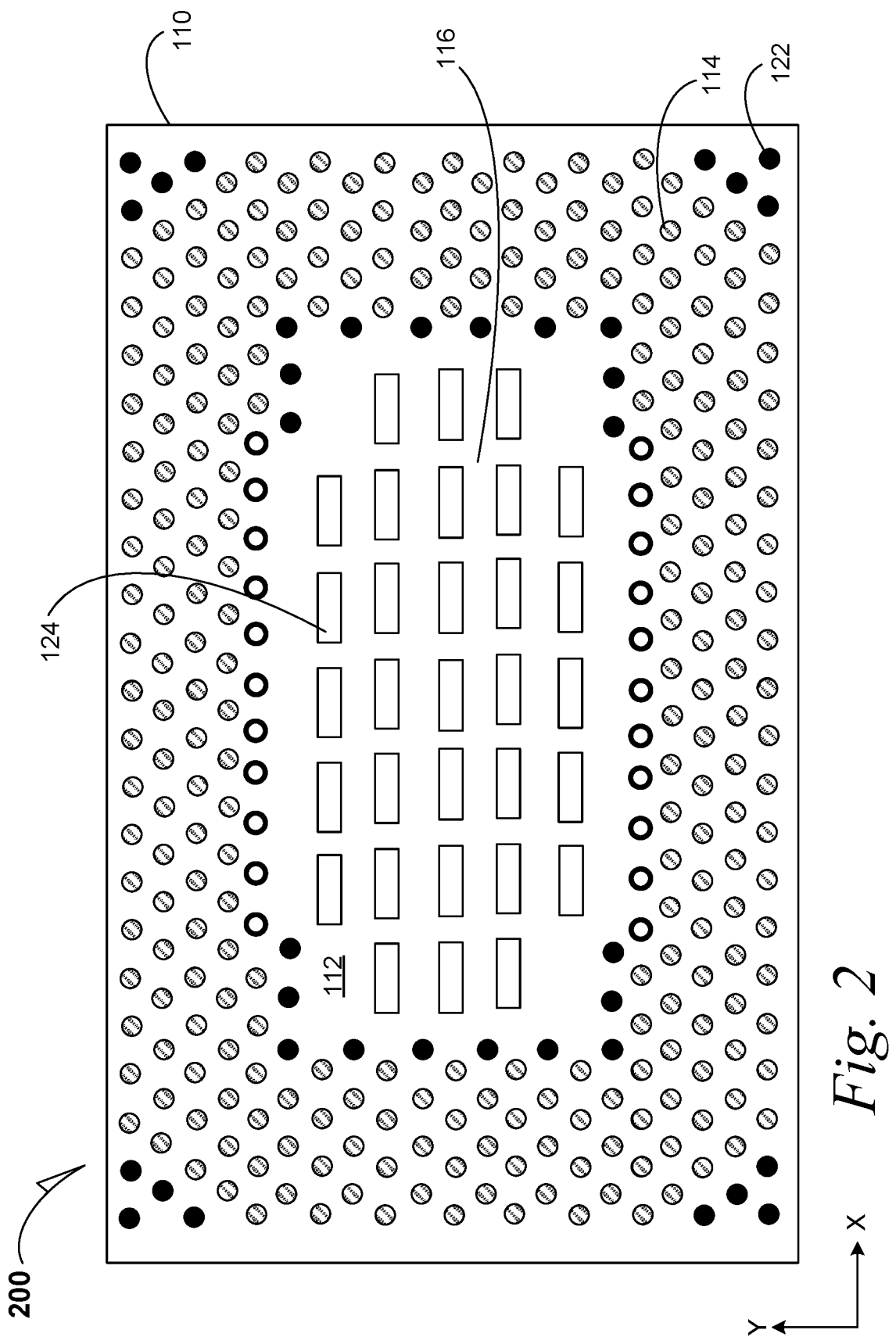
FIG. 2 is a bottom plan of a semiconductor package substrate according to an embodiment.

FIG. 2 is a bottom plan 200 of a semiconductor package substrate 110 according to an embodiment. The semiconductor package substrate 110 depicted in FIG. 1 may be further processed to achieve the semiconductor package substrate 110 depicted in FIG. 2. At least one device is mounted on the land side surface 112 of the semiconductor substrate 110, one exemplary incidence of which is indicated with reference number 124. As illustrated, the several devices 124 are arrayed in seven columns of three each (two columns) and five each (five columns) for a total of 31 devices. In an embodiment, the device 124, or one of them, is a capacitor. In an embodiment, the device 124, or one of them, is an inductor. In an embodiment, the device 124, or one of them, is a resistor. In an embodiment, the device 124, or one of them, is an active device such as a semiconductive processor.

FIG. 3A is a cross-section elevation 301 of a semiconductor package substrate 310 that carries at least one device 324 mounted on the land side 312 of the package substrate 310 according to an embodiment. The semiconductor package substrate 112 depicted in FIG. 2 may be further processed to achieve the semiconductor package substrate 312 depicted in FIG. 3. The ball-grid array depicted in FIGS. 1 and 2 is illustrated in simplified form (lower ball count) in FIG. 3A.

In an embodiment, a first semiconductive device 326 such as a central processing unit (CPU) 326 is disposed on a die side 328 of the package substrate 310. In an embodiment, a subsequent semiconductive device 330 is also disposed on the die side 328 and adjacent the first semiconductive device 236.

Because of the thermal and physical stresses that are experienced on the package substrate 310, a cavity support structure 332 is being inserted into a central enclave 316, or central cavity region 316, to cover the several devices 324 as well as to contact the land side 312. In an embodiment, the support structure 332 is prefabricated to create a land-side-device negative profile that includes several land-side-device seats 331 as well as several land-side-board seats 313. In an embodiment, seating of the support structure 332 onto the package land side 312 is assisted by use of an adhesive 311 that may be pre-applied to either the support structure (as illustrated) or onto the package land side 312.

In an embodiment, the support structure 332 also has a bump-level surface 333 that is a useful gauge for reflow seating the several electrical bumps (general bump 314 and a peripheral bump 320 enumerated) upon a printed wiring board such as a mother board. The ball-grid array depicted in FIGS. 1 and 2 is illustrated in simplified form in FIG. 3A.

FIG. 3B is a cross-section elevation 302 of the semiconductor package substrate 310 depicted in FIG. 3A after further assembly according to an embodiment. The semiconductor package substrate 110 depicted in FIG. 2 may be further processed after having inserted the support structure 332 into the central enclave 316 (see FIG. 3A) and over the several devices 324 according to an embodiment.

In an embodiment, a pick-and-place technology is used to locate the support structure 332 onto the land side 312. The pick-and-place technology may use a vacuum-type device that may have an anti-stick interface if the support structure 332 is green and therefore exhibits green adhesive tendencies.

In an embodiment, a first semiconductive device 326 such as a central processing unit (CPU) 326 is disposed on a die side 328 of the package substrate 310. In an embodiment, a subsequent semiconductive device 330, such as a platform controller hub (PCH) is also disposed on the die side 328 and adjacent the first semiconductive device 326.

Because of the thermal and physical stresses that are experienced on the package substrate 310, the cavity support structure 332 is being inserted to cover the several devices 324 as well as to contact the land side 312. In an embodiment, the support structure 332 is prefabricated to create a land-side-device negative profile that includes several land-side-device seats 331 as well as several land-side-board seats 313. In an embodiment, the support structure 332 also has a bump-level surface 333 that is a useful gauge for reflow seating the several electrical bumps (general bump 314 and a peripheral bump 320 enumerated) upon a printed wiring board such as a mother board.

In an embodiment, a board 350 such as a motherboard 350 is provided for mounting the ball-grid array 314 and the support structure 332. As illustrated, the bump-level surface 333 is a useful gauge to assist in a selected bump height upon the board 350.

In an embodiment, the board 350 includes an external shell 352 that provides both physical and electrical insulation for devices within the external shell 352.

In an embodiment, insertion of the cavity support structure 332 is achieved by using a green, and therefore pliant material such that X-Y direction spacing clearance for the components 324 can be minimized. As illustrated in the X-direction in FIG. 3B, virtually no X-direction spacing clearance is depicted. In an embodiment, insertion of the cavity support structure 332 is achieved by using a cured, but spacing-clearance accommodating support structure 332. In an embodiment, spacing clearance is 5% on both sides, or the total X-direction width of a given component 324 to allow the component to be undisturbed by the support structure 332, but still sufficient support is provided within the cavity region. This clearance, if 5%, is also provided for the Y-direction clearance.

Material of the support structure are selected according to useful applications. In an embodiment, a green molding compound with a Young's Modulus of greater than 20 Giga Pascals (GPa) is used. A coefficient of thermal expansion (CTE) is selected of less than 10 part per million per degree Centigrade (ppm/C). In an embodiment, the material is a plastic such as an epoxy. In an embodiment, the material is a plastic such as a polysiloxane acrylic material. In an embodiment, the material is a plastic such as a polysiloxane epoxy. In an embodiment, the material is a high-modulus glass. In an embodiment, the material is a carbon fiberreinforced organic. In an embodiment, the material is a non-woven and paper-based epoxy. In an embodiment, an inorganic filler is added to the material. In an embodiment, the material is a metal that is dielectric coated within the seat area such as the seat area 431.

Figure 4:
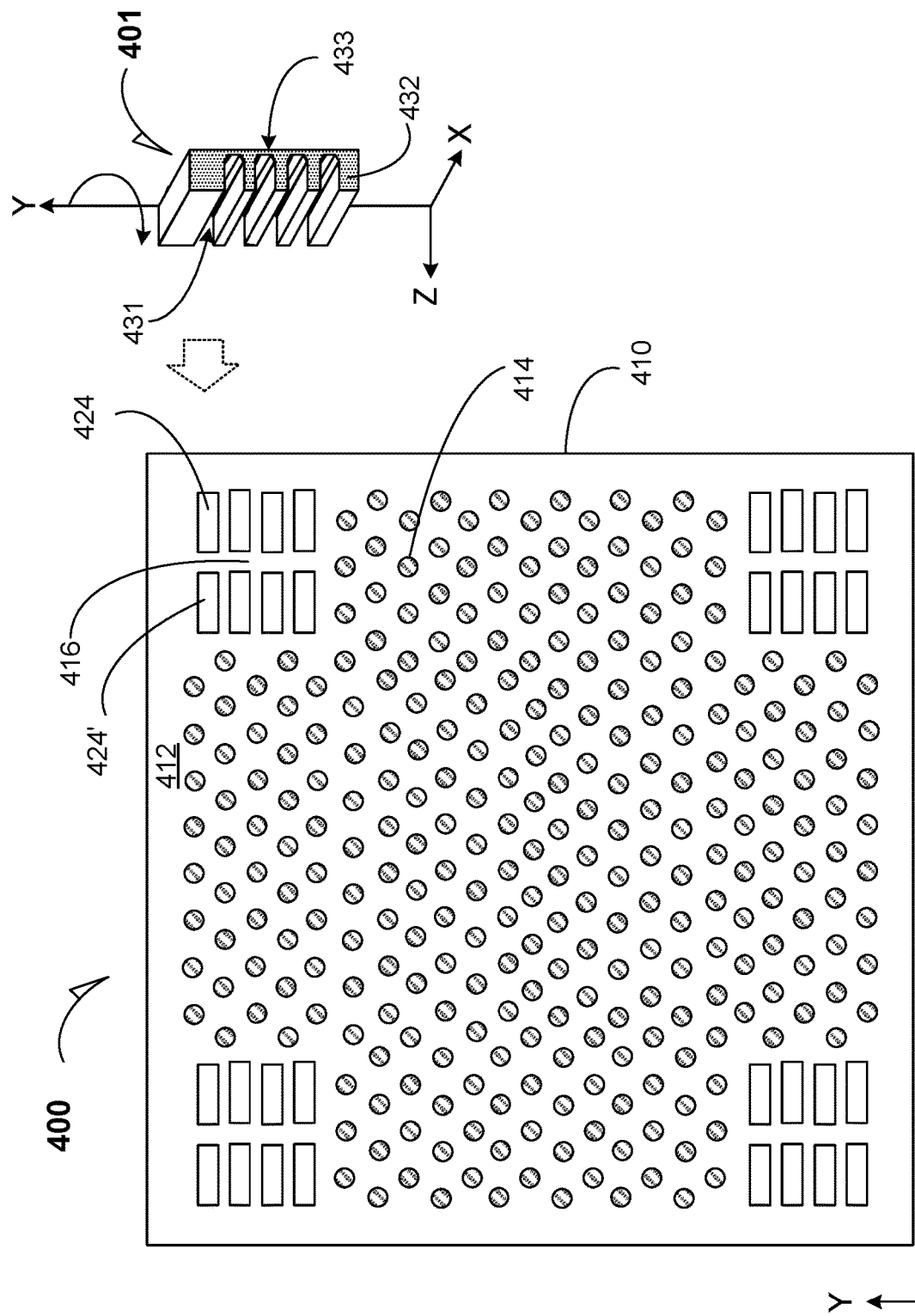
FIG. 4 is a bottom plan and a perspective elevation of a semiconductor package substrate that carries at least one device mounted on the land side of the package substrate at a corner location, or a corner exclave region, of a ball-grid array according to an embodiment.

FIG. 4 is a bottom plan 400 and a perspective elevation 401 of a semiconductor package substrate 410 that carries at least one device 424 mounted on the land side 412 of the package substrate 410 at a corner location 416, or a corner exclave region 416, of a ball-grid array according to an embodiment.

Because of the thermal and physical stresses that are experienced on the package substrate 410, a peripheral cavity support structure 432 is being inserted to cover the several devices 424 as well as to contact the land side 412. In an embodiment, the peripheral cavity support structure 432 is prefabricated to create a land-side-device negative profile that includes several land-side-device seats 431. In an embodiment, seating of the support structure 432 onto the package land side 412 is assisted by use of an adhesive (not pictured) similar to the adhesive 311 depicted in FIG. 3A.

In an embodiment, the peripheral cavity support structure 432 also has a bump-level surface 433 that is a useful gauge for reflow seating the several electrical bumps (general bump 414 upon a printed wiring board such as a mother board.

The perspective elevation 401 of the peripheral cavity support structure 432 is illustrated being moved in the X-direction and rotated about the Y-axis to be seated onto the land side 412, where the device 424 is located. Four occurrences of the peripheral cavity support structure 432 are used and applied to the land side 412 at each corner of the package substrate 410 according to an embodiment. In an embodiment, the peripheral cavity support structure is pre-fabricated and installed upon the package substrate land side 412. As illustrated, the peripheral cavity support structure 432 may be sufficiently long in the X-direction, that each land-side-device seat 431 covers two devices 424 and 424' as they are aligned with their major dimension running along the X-direction. In an embodiment, the peripheral cavity support structure 432 is long enough only to cover the outermost devices (in this illustrated embodiment, four devices 424 along the edge of the package substrate 410. In other words, the peripheral cavity support structure 432 covers fewer than all of the devices within the exclave region.

In an embodiment, a pick-and-place technology is used to locate the support structure 432 onto the land side 412. The pick-and-place technology may use a vacuum-type device that may have an anti-stick interface if the support structure 432 is green and therefore exhibits green adhesive tendencies.

Figure 5:
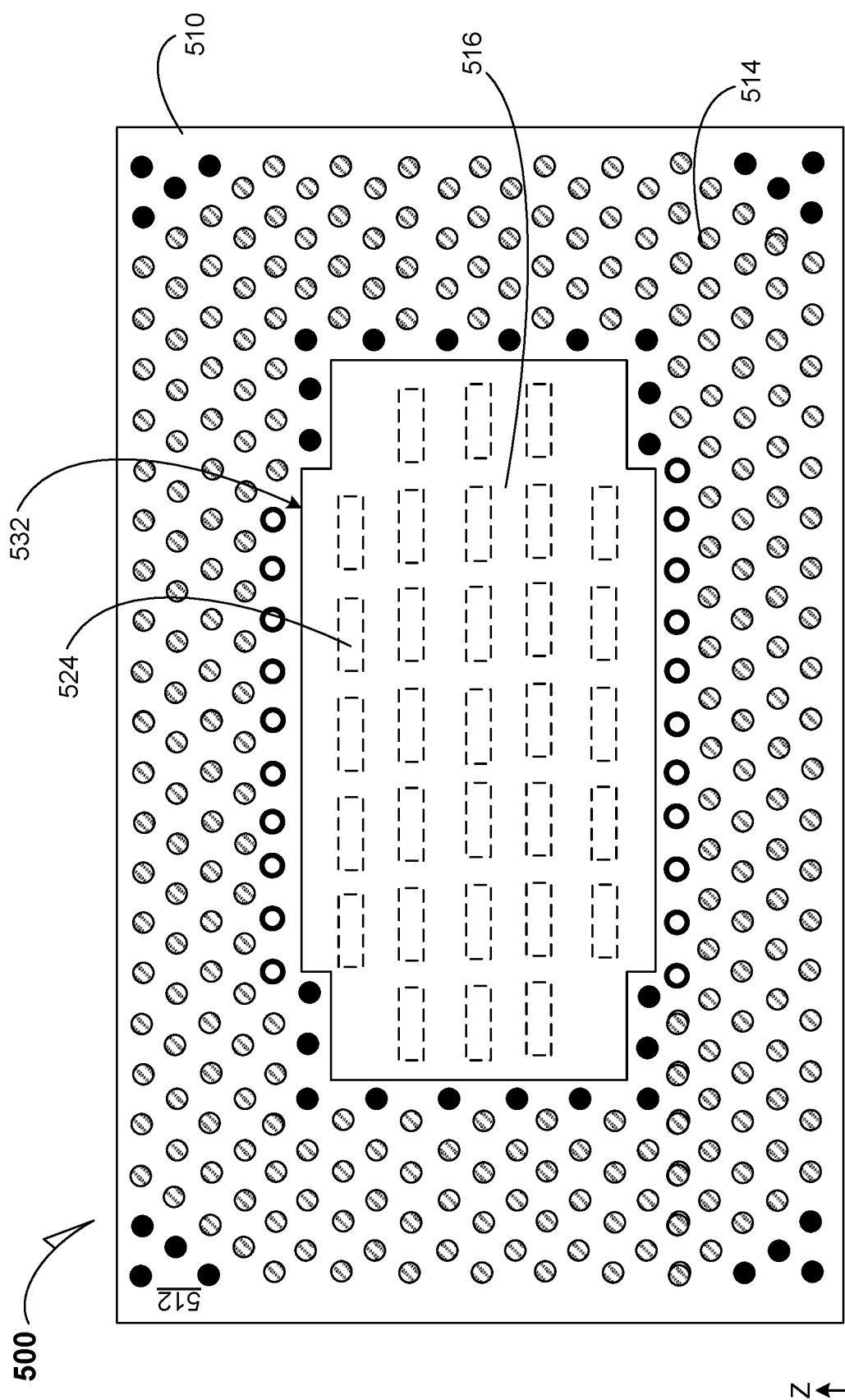
FIG. 5 is a bottom plan of a semiconductor package substrate that includes a central cavity support structure according to an embodiment.

FIG. 5 is a bottom plan 500 of a semiconductor package substrate 510 that includes a central cavity support structure 532 according to an embodiment. The semiconductor package substrate 110 depicted in FIG. 1 may be further processed to achieve the semiconductor package substrate 510 depicted in FIG. 5.

In an embodiment, at least one device is mounted on the land side surface 512 of the semiconductor substrate, one exemplary incidence of which is indicated with reference number 524. In an embodiment, the device 524, or one of them, is a capacitor. In an embodiment, the device 524, or one of them, is an inductor. In an embodiment, the device 524, or one of them, is a resistor. In an embodiment, the device 524, or one of them, is an active device such as a semiconductive processor.

The central cavity, or enclave region support structure 532 can be pre-fabricated similarly to the central cavity support structure 332 and 432 depicted in FIGS. 3A, 3B and 4. In an embodiment, the central cavity support structure 532 is flowed into place by using a green molding compound, followed by curing. In an embodiment, the central cavity support structure 532 is injected into place such as by a patterned injector that drives the central cavity support structure 532 onto the devices 524 and causes the central cavity support structure 532 to flow around the several devices, but it is constrained at the perimeter indicated by the arrow head touching item 532.

Figure 6:
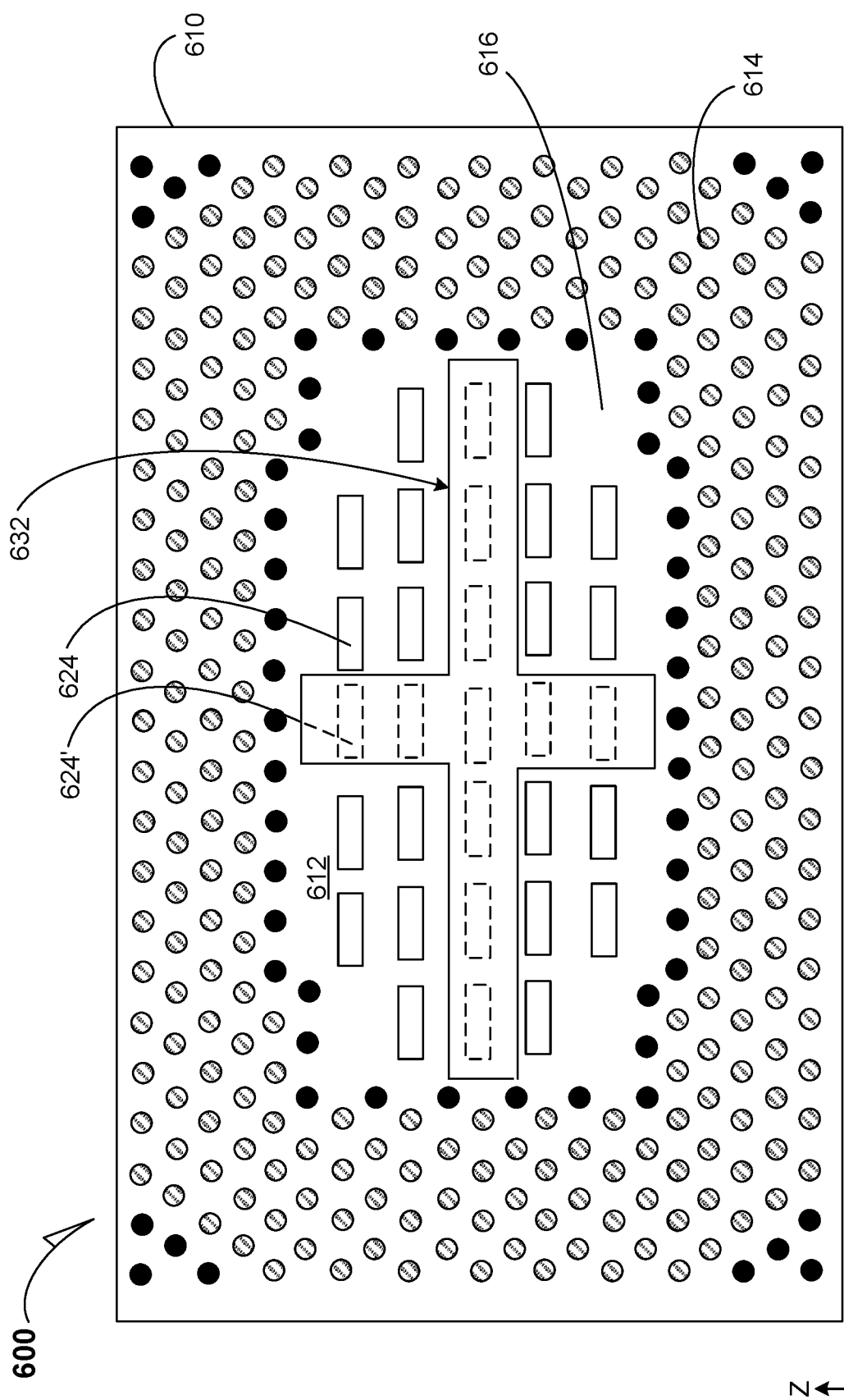
FIG. 6 is a bottom plan of a semiconductor package substrate that includes a central cavity support structure according to an embodiment.

FIG. 6 is a bottom plan 600 of a semiconductor package substrate 610 that includes a central cavity support structure 632 according to an embodiment. The semiconductor package substrate 110 depicted in FIG. 1 may be further processed to achieve the semiconductor package substrate 610 depicted in FIG. 6.

In an embodiment, at least one device is mounted on the land side surface 612 of the semiconductor substrate, one exemplary incidence of which is indicated with reference number 624. In an embodiment, the device 624, or one of them, is a capacitor. In an embodiment, the device 624, or one of them, is an inductor. In an embodiment, the device 624, or one of them, is a resistor. In an embodiment, the device 624, or one of them, is an active device such as a semiconductive processor.

The central cavity support structure 632 can be pre-fabricated similarly to the central cavity support structures 332 and 432 depicted in FIGS. 3A, 3B and 4. In an embodiment, the central cavity support structure 632 is flowed into place by using a green molding compound, followed by curing. In an embodiment, the central cavity support structure 632 is injected into place such as by a cross-patterned injector that drives the central cavity support structure 632 onto the covered devices 624' (one instance enumerated and depicted in ghosted lines) while not covering the devices 624, (one instance enumerated and depicted in solid lines), and causes the central cavity support structure 632 to flow around the several devices, but it is constrained at the perimeter indicated by the arrow head touching item 632. In an embodiment, the cross-patterned central cavity support structure is used to address particular areas of warpage tendency, to counter the warpage.

Figure 7:
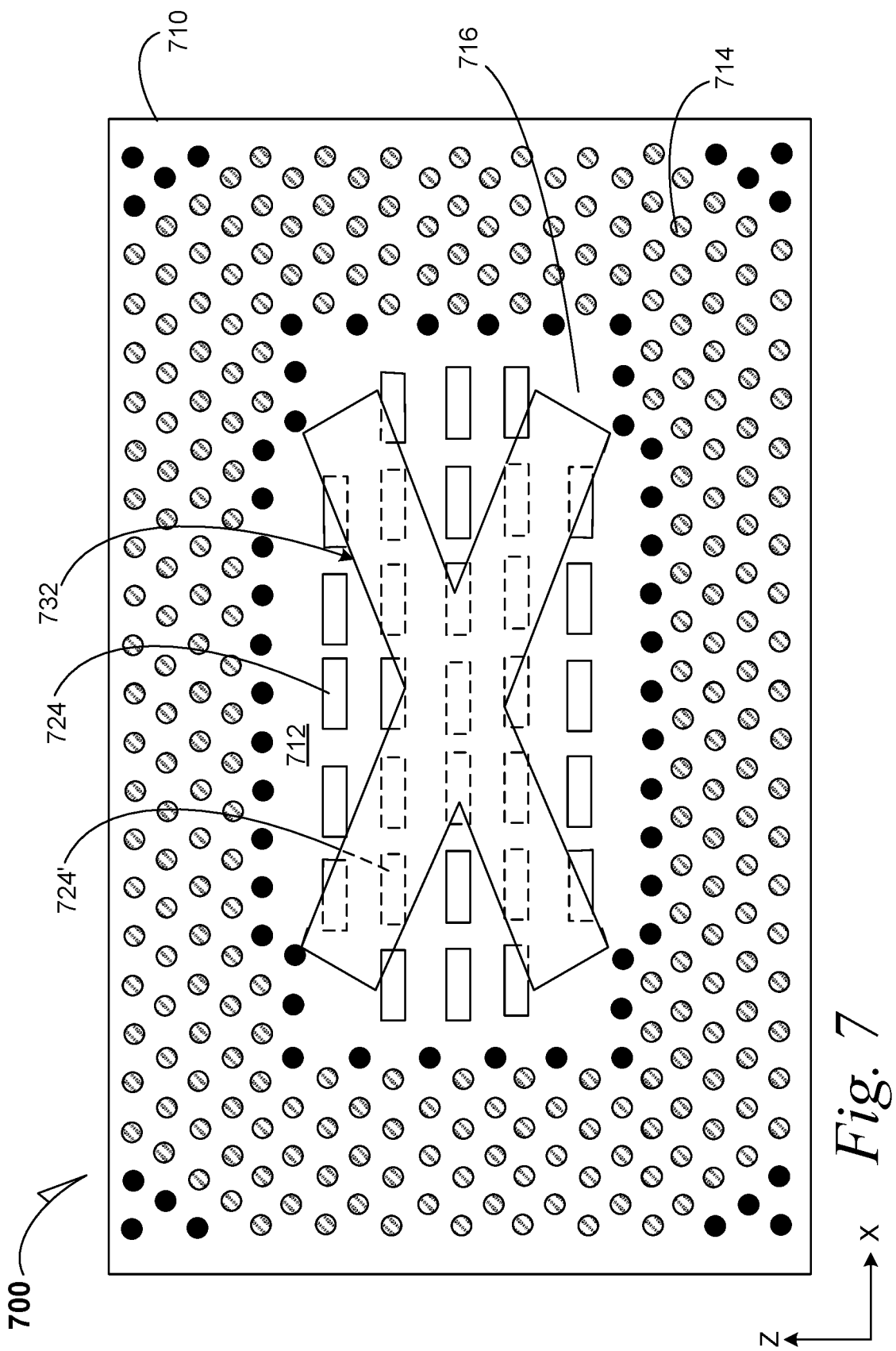
FIG. 7 is a bottom plan of a semiconductor package substrate that includes a central cavity support structure according to an embodiment.

FIG. 7 is a bottom plan 700 of a semiconductor package substrate 710 that includes a central cavity support structure 732 according to an embodiment. The semiconductor package substrate 110 depicted in FIG. 1 may be further processed to achieve the semiconductor package substrate 710 depicted in FIG. 7.

In an embodiment, at least one device is mounted on the land side surface 712 of the semiconductor substrate, one exemplary incidence of which is indicated with reference number 724. In an embodiment, the device 724, or one of them, is a capacitor. In an embodiment, the device 724, or one of them, is an inductor. In an embodiment, the device 724, or one of them, is a resistor. In an embodiment, the device 724, or one of them, is an active device such as a semiconductive processor.

The central cavity support structure 732 can be pre-fabricated similarly to the central cavity support structure 332 and 432 depicted in FIGS. 3A, 3B and 4. In an embodiment, the central cavity support structure 732 is flowed into place by using a green molding compound, followed by curing. In an embodiment, the central cavity support structure 732 is injected into place such as by an X-patterned injector that drives the central cavity support structure 732 onto the covered devices 724' (depicted in ghosted lines) while not covering the devices 724, depicted in solid lines, and causes the central cavity support structure 732 to flow around the several devices, but it is constrained at the perimeter indicated by the arrow head touching item 732. In an embodiment, the cross-patterned central cavity support structure is used to address particular areas of warpage tendency, to counter the warpage.

Figure 8:
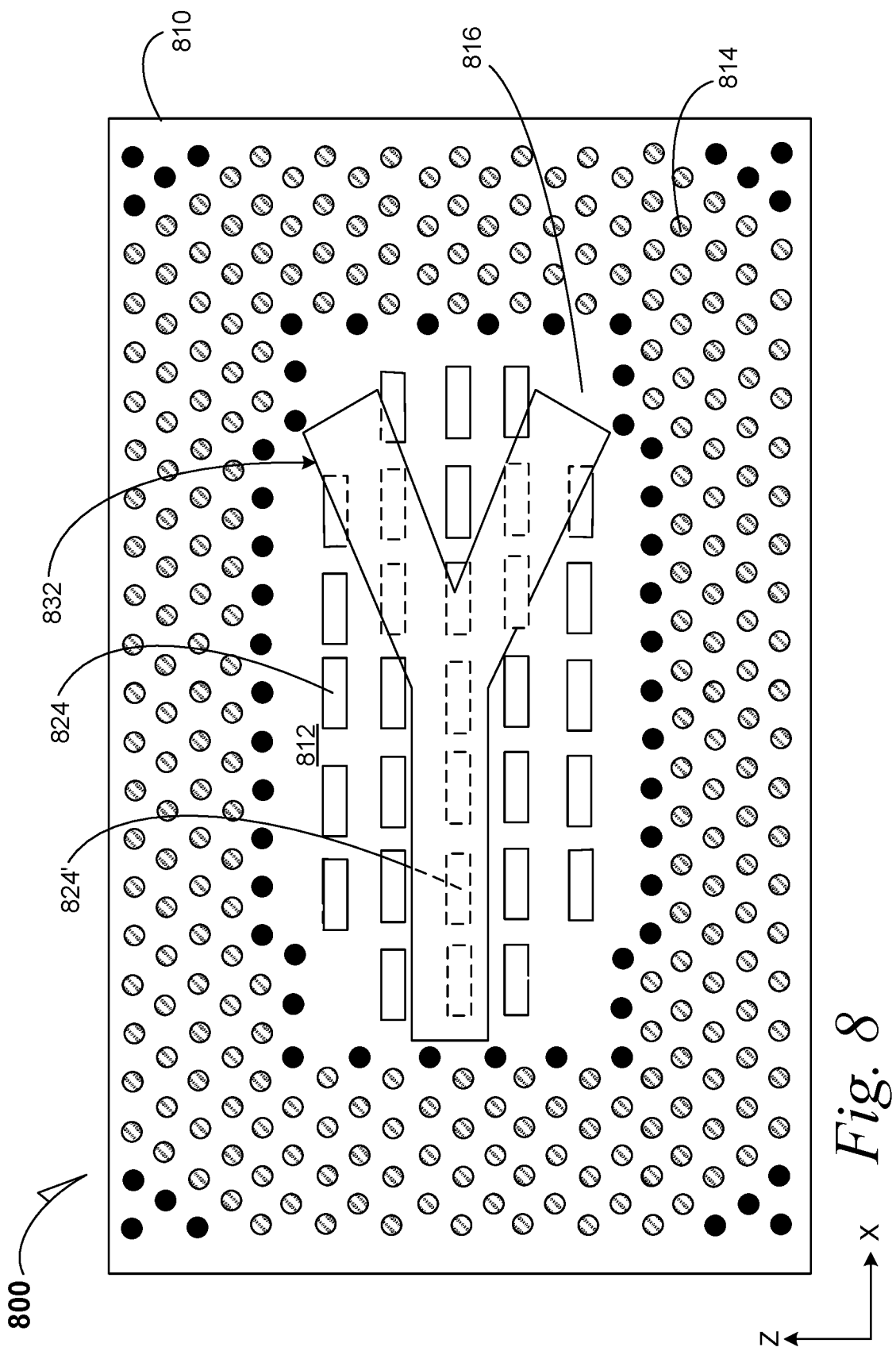
FIG. 8 is a bottom plan of a semiconductor package substrate that includes a central cavity support structure according to an embodiment.

FIG. 8 is a bottom plan 800 of a semiconductor package substrate 810 that includes a central cavity support structure 832 according to an embodiment. The semiconductor package substrate 110 depicted in FIG. 1 may be further processed to achieve the semiconductor package substrate 810 depicted in FIG. 8.

In an embodiment, at least one device is mounted on the land side surface 812 of the semiconductor substrate, one exemplary incidence of which is indicated with reference number 824. In an embodiment, the device 824, or one of them, is a capacitor. In an embodiment, the device 824, or one of them, is an inductor. In an embodiment, the device 824, or one of them, is a resistor. In an embodiment, the device 824, or one of them, is an active device such as a semiconductive processor.

The central cavity support structure 832 can be prefabricated similarly to the central cavity support structure 332 and 432 depicted in FIGS. 3A, 3B and 4. In an embodiment, the central cavity support structure 832 is flowed into place by using a green molding compound, followed by curing. In an embodiment, the central cavity support structure 832 is injected into place such as by a lazy Y-patterned injector that drives the central cavity support structure 832 onto the covered devices 824' (depicted in ghosted lines) while not covering the devices 824, depicted in solid lines, and causes the central cavity support structure 832 to flow around the several devices, but it is constrained at the perimeter indicated by the arrow head touching item 832. In an embodiment, the cross-patterned central cavity support structure is used to address particular areas of warpage tendency, to counter the warpage.

It should now be understood that any useful form factor may be used for a given support structure, and as a "T" or cross in FIG. 6, an X in FIG. 7, or a lazy Y in FIG. 8 are depicted, other form factors may be used including a curvilinear structure such as a circle or an oval.

Figure 9:
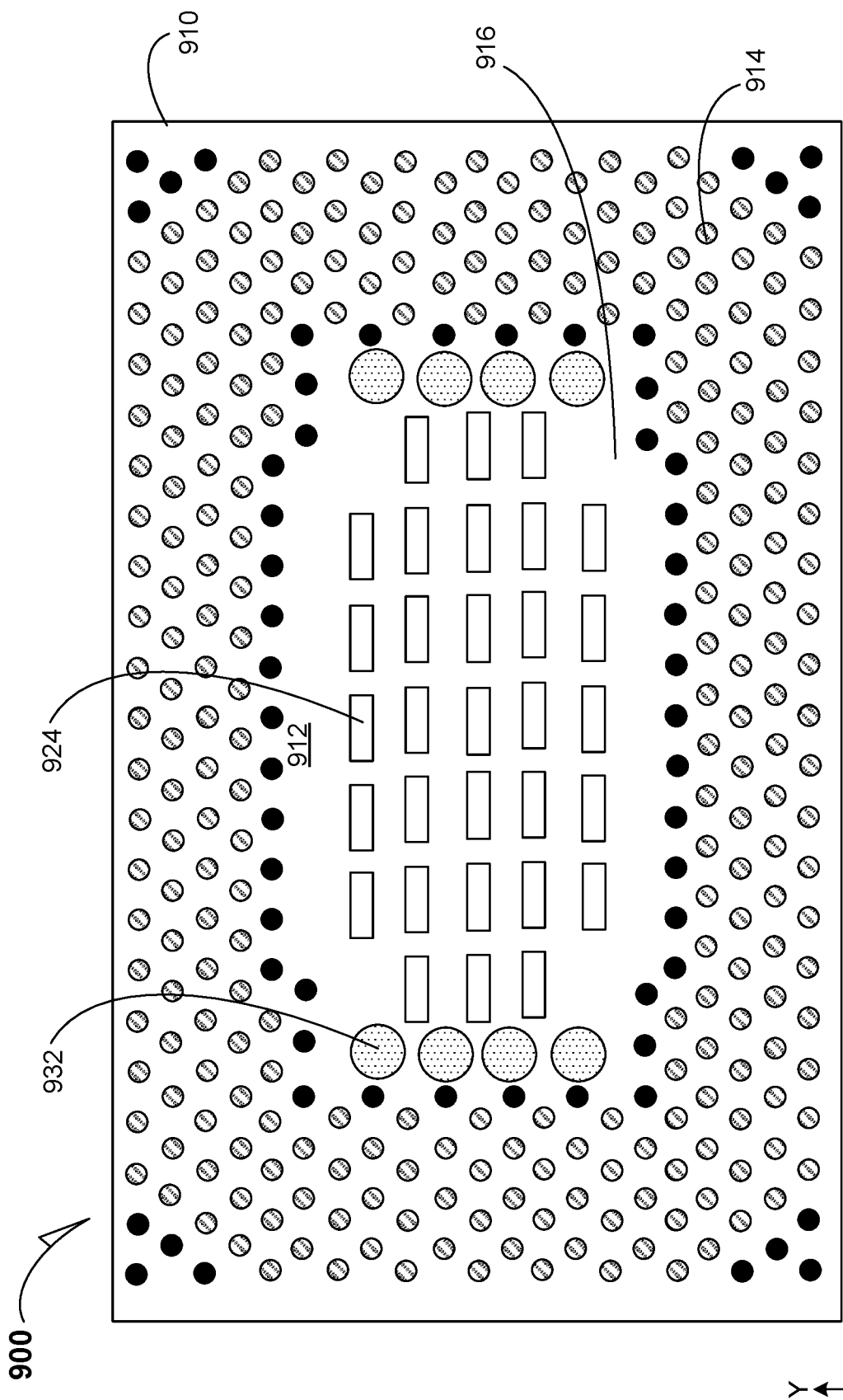
FIG. 9 is a bottom plan of a semiconductor package substrate that includes a central cavity peripheral support structure according to an embodiment.

FIG. 9 is a bottom plan 900 of a semiconductor package substrate 910 that includes a central cavity peripheral support structure 932 according to an embodiment. The semiconductor package substrate 110 depicted in FIG. 1 may be further processed to achieve the semiconductor package substrate 910 depicted in FIG. 9. Eight occurrences of the central cavity peripheral support structure 932 are depicted on the land side 912. In an embodiment, these several peripheral support structures 932 are solid-cylinder post shaped structures.

In an embodiment, at least one device is mounted on the land side surface 912 of the semiconductor substrate, one exemplary incidence of which is indicated with reference number 924. In an embodiment, the device 924, or one of them, is a capacitor. In an embodiment, the device 924, or one of them, is an inductor. In an embodiment, the device 924, or one of them, is a resistor. In an embodiment, the device 924, or one of them, is an active device such as a semiconductive processor.

The central cavity support structure 932 can be prefabricated similarly to the central cavity support structure 332 and 432 depicted in FIGS. 3A, 3B and 4. In an embodiment, the central cavity support structure 932 is flowed into place by using a green molding compound, followed by curing. In an embodiment, the central cavity support structure 932 is injected into place such as by a circular post patterned injector that drives the central cavity support structure 932 at the periphery of the central cavity 916. In an embodiment, the cross-patterned central cavity support structure is used to address particular areas of warpage tendency, to counter the warpage.

Figure 10:
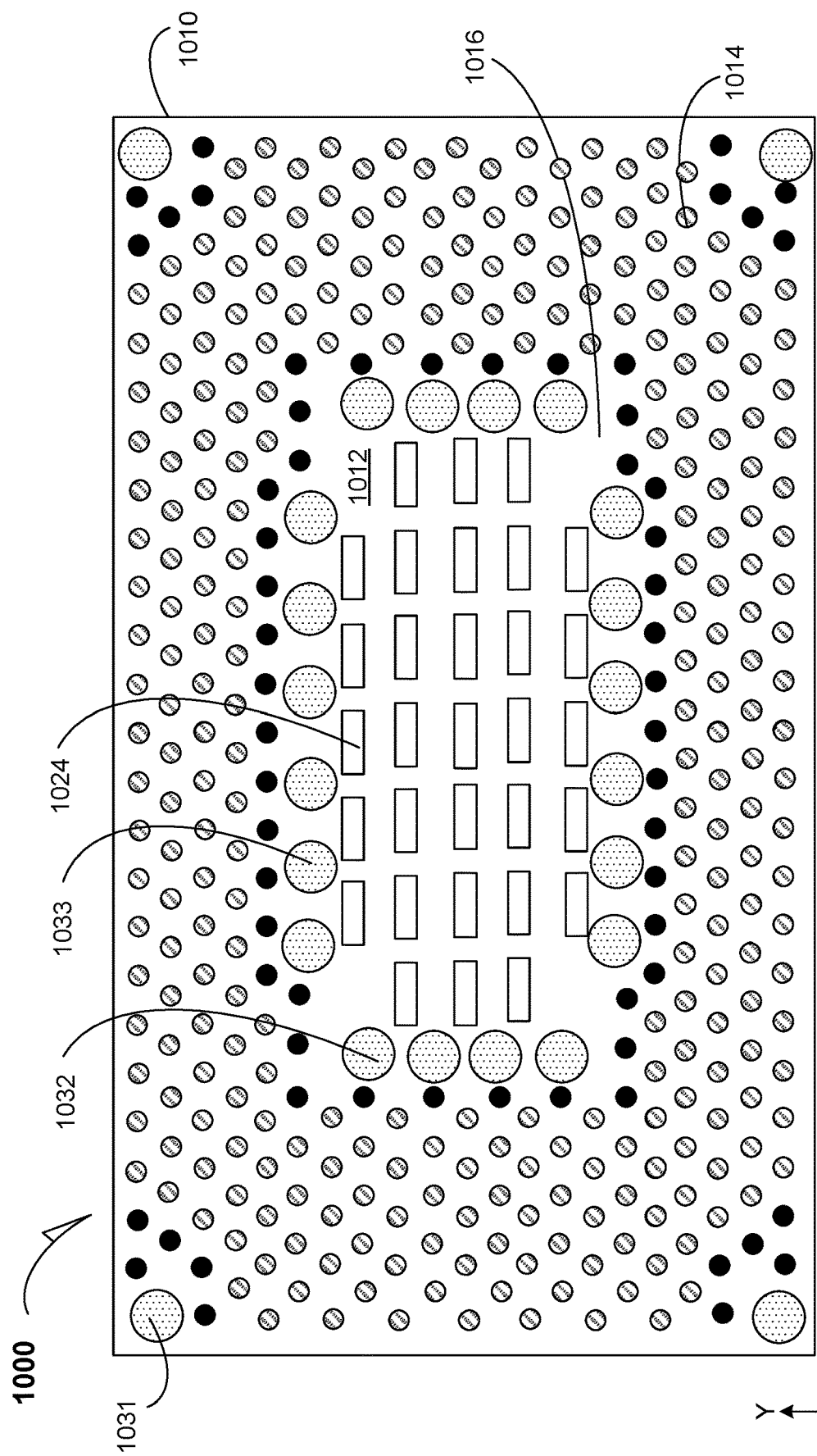
FIG. 10 is a bottom plan of a semiconductor package substrate that includes central cavity peripheral support structures, and package ball-grid array external corner support structures, according to an embodiment.

FIG. 10 is a bottom plan 1000 of a semiconductor package substrate 1010 that includes central cavity peripheral support structures 1032 and 1033, and package ball-grid array external corner support structures 1032, according to an embodiment. Eight occurrences of the central cavity peripheral support structure 1032 and 12 occurrences of the central cavity peripheral support structure 1033, as well as four occurrences of the end package ball-grid array external corner support structures 1031 are depicted on the land side 1012. In an embodiment, these several support structures 1031, 1032 and 1033 are solid-cylinder post shaped structures.

In an embodiment, at least one device is mounted on the land side surface 1012 of the semiconductor substrate, one exemplary incidence of which is indicated with reference number 1024. In an embodiment, the device 1024, or one of them, is a capacitor. In an embodiment, the device 1024, or one of them, is an inductor. In an embodiment, the device 1024, or one of them, is a resistor. In an embodiment, the device 1024, or one of them, is an active device such as a semiconductive processor.

In an embodiment, the support structures 1031, 1032 and 1033 are flowed into place by using a green molding compound, followed by curing. In an embodiment, the support structures 1031, 1032 and 1033 are injected into place such as by a circular post patterned injector.

Figure 11:
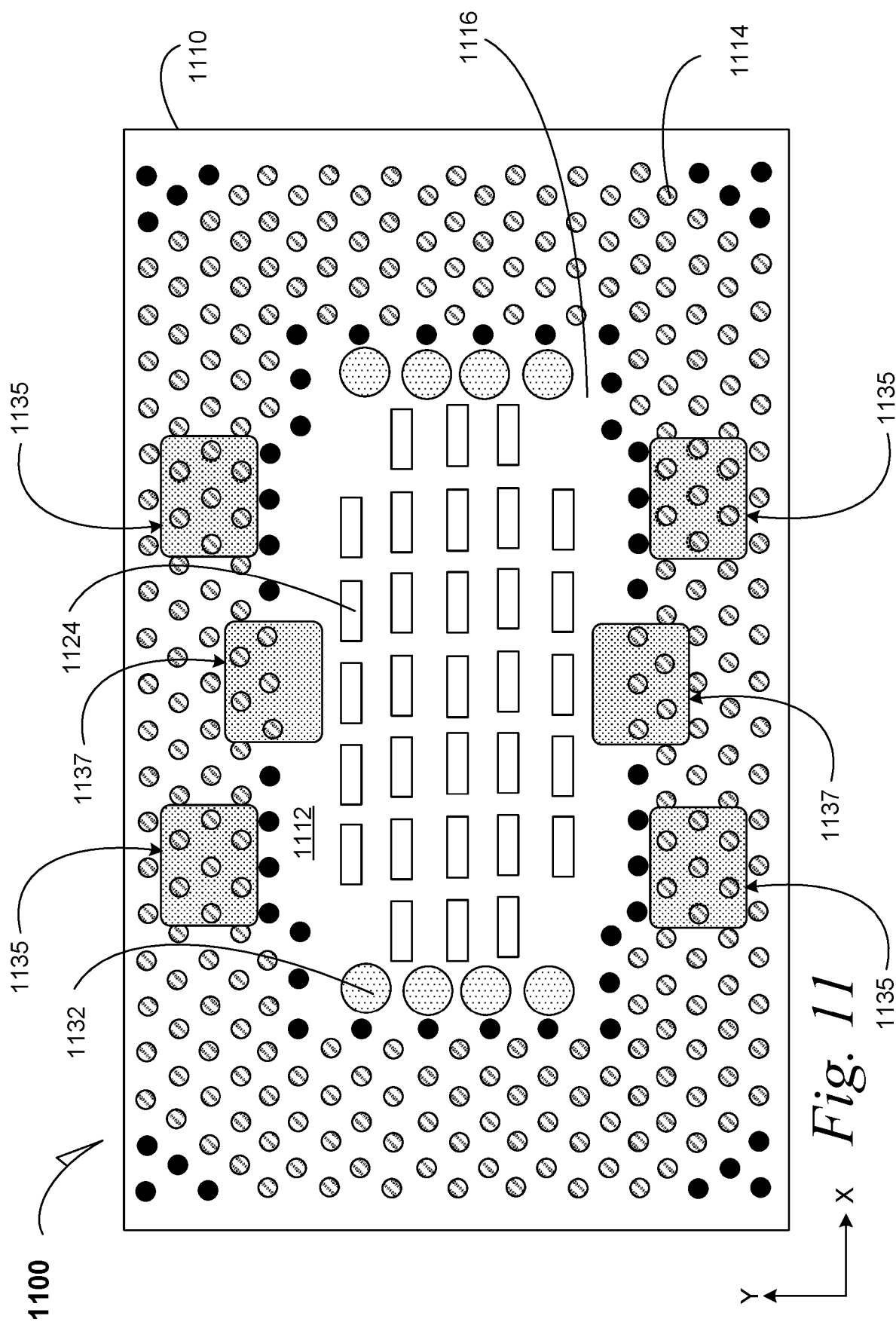
FIG. 11 is a bottom plan of a semiconductor package substrate that includes central cavity peripheral support structures, and bump-interstitial support structures, according to an embodiment.

FIG. 11 is a bottom plan 1100 of a semiconductor package substrate 1110 that includes central cavity peripheral support structures 1132, bump-interstitial support structures 1135 and 1137, according to an embodiment. Eight occurrences of the central cavity peripheral support structure 1132 may be similar to the support structures 1032 depicted in FIG. 10. In an embodiment, a full bump-interstitial support structure 1135 is inserted onto the semiconductor package substrate land side 1112. Four occurrences of this full-bump-interstitial support structure 1135 are illustrated. In an embodiment, a partial-bump-interstitial support structure 1137 is inserted onto the semiconductor package substrate land side 1112, and a portion is located between the bumps 1114 in general and the devices 1124. Two occurrences of this partial-bump-interstitial support structure 1135 are illustrated.

Figure 12:
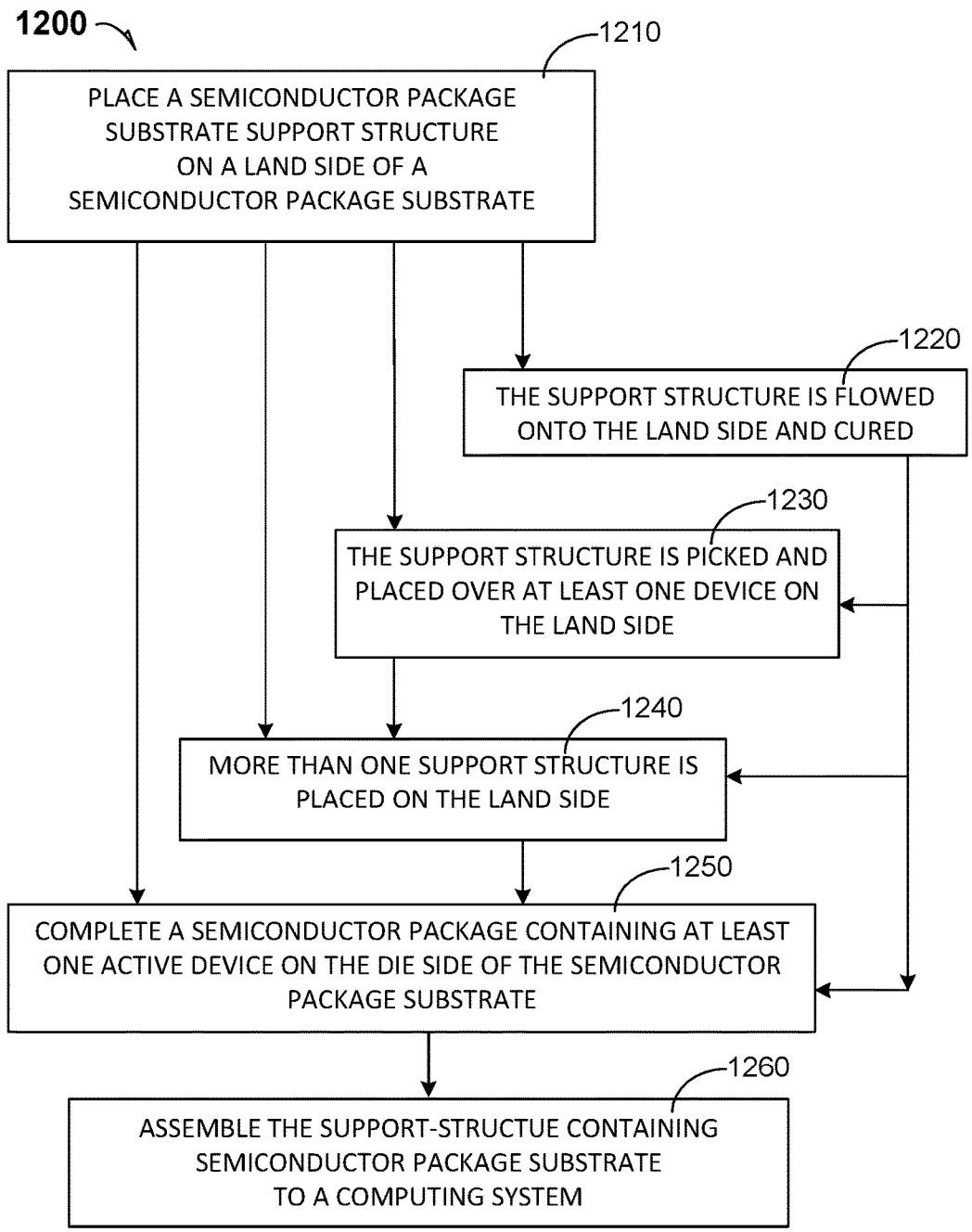
FIG. 12 is a process flow diagram according to several embodiments.

FIG. 12 is a process flow diagram 1200 according to several embodiments.

At 1210, the process includes placing a semiconductor package substrate support structure on a land side of a semiconductor package substrate.

At 1220, the process includes flowing a support structure precursor onto the land side, followed by curing.

At 1230, the process includes pick-and-place locating at least one support structure onto the land side.

At 1240, more than one he support structure is located on the land side. In an embodiment, one support structure is pick-and-place located, and one support structure is flow-and-cure located.

At 1250, the process includes completing a semiconductor package containing at least one support structure. In a non-limiting example embodiment, a CPU is placed on the semiconductor package substrate on the die side that is opposite the land side.

At 1260, the process includes assembling the support-structure containing semiconductor package substrate to a computing system. Computing system embodiments are disclosed herein.

Figure 13:
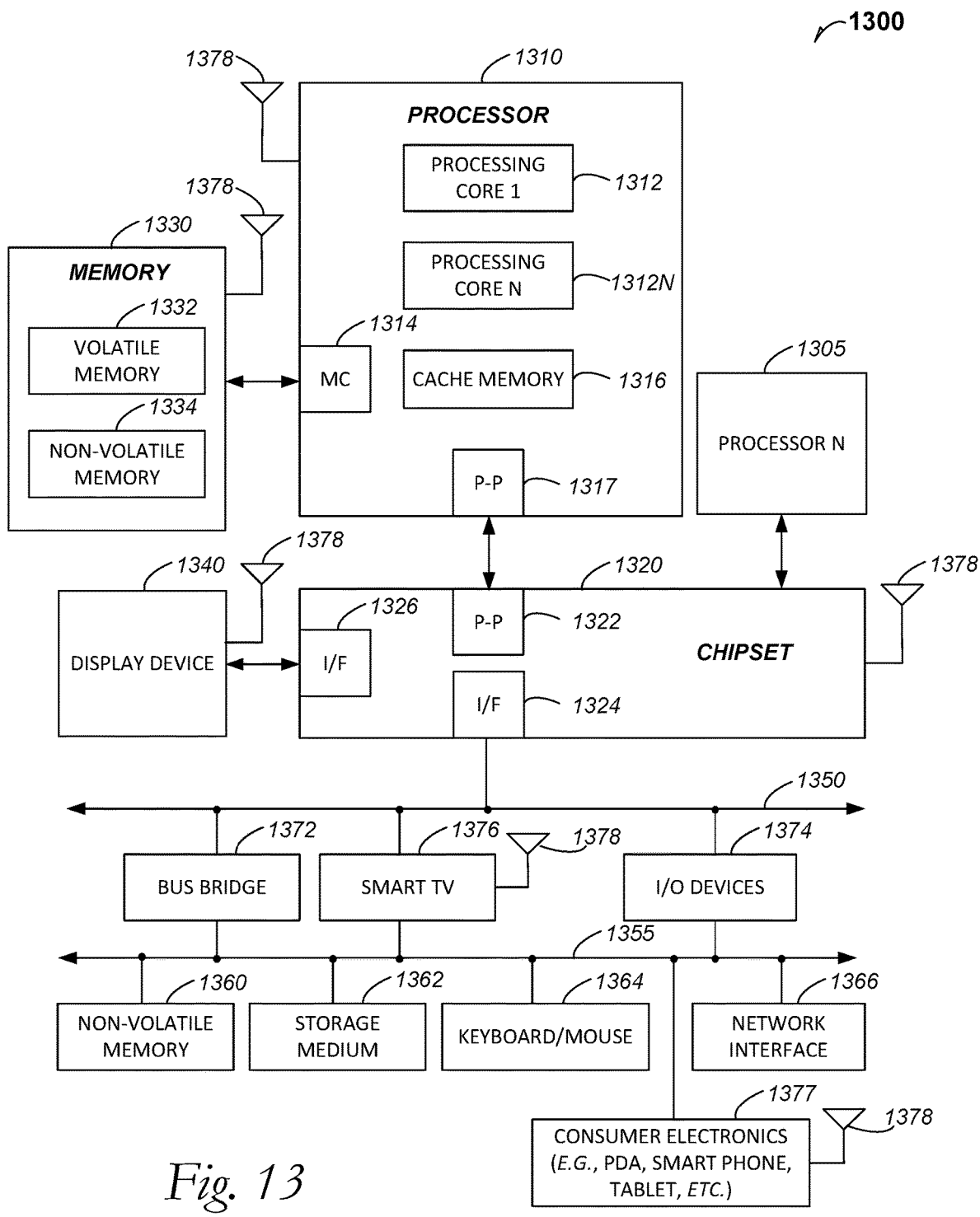
FIG. 13 is included to show an example of a higher-level device application for the disclosed embodiments.

FIG. 13 is included to show an example of a higher-level device application for the disclosed embodiments. The support-structure containing semiconductor package embodiments may be found in several parts of a computing system. In an embodiment, a support-structure containing semiconductor package includes, but is not limited to, a desktop computer. In an embodiment, a support-structure containing semiconductor package computing system 1300 includes, but is not limited to a laptop computer. In an embodiment, a support-structure containing semiconductor package computing system 1300 includes, but is not limited to a netbook. In an embodiment, a support-structure containing semiconductor package computing system 1300 includes, but is not limited to a tablet. In an embodiment, a support-structure containing semiconductor package computing system 1300 includes, but is not limited to a notebook computer. In an embodiment, a support-structure containing semiconductor package computing system 1300 includes, but is not limited to a personal digital assistant (PDA). In an embodiment, a support-structure containing semiconductor package computing system 1300 includes, but is not limited to a server. In an embodiment, a support-structure containing semiconductor package computing system 1300 includes, but is not limited to a workstation. In an embodiment, a support-structure containing semiconductor package computing system 1300 includes, but is not limited to a cellular telephone. In an embodiment, a support-structure containing semiconductor package computing system 1300 includes, but is not limited to a mobile computing device. In an embodiment, a support-structure containing semiconductor package computing system 1300 includes, but is not limited to a smart phone. In an embodiment, a support-structure containing semiconductor package computing system 1300 includes, but is not limited to an internet appliance. In an embodiment, the support-structure containing semiconductor package computing system is part of a wearable computing system. In an embodiment, the support-structure containing semiconductor package computing system is part of a drone. Other types of computing devices may be configured with the support-structure containing semiconductor package computing system that includes non-planar interconnect embodiments.

In an embodiment, the processor 1310 has one or more processing cores 1312 and 1312N, where 1312N represents the Nth processor core inside processor 1310 where N is a positive integer. In an embodiment, the electronic device system 1300 using a support-structure containing semiconductor package computing system embodiment that includes multiple processors including 1310 and 1305, where the processor 1305 has logic similar or identical to the logic of the processor 1310. In an embodiment, the processing core 1312 includes, but is not limited to, pre-fetch logic to fetch instructions, decode logic to decode the instructions, execution logic to execute instructions and the like. In an embodiment, the processor 1310 has a cache memory 1316 to cache at least one of instructions and data for the printed wiring-board island in the system 1300. The cache memory 1316 may be organized into a hierarchal structure including one or more levels of cache memory.

In an embodiment, the processor 1310 includes a memory controller 1314, which is operable to perform functions that enable the processor 1310 to access and communicate with memory 1330 that includes at least one of a volatile memory 1332 and a non-volatile memory 1334. In an embodiment, the processor 1310 is coupled with memory 1330 and chipset 1320. The processor 1310 may also be coupled to a wireless antenna 1378 to communicate with any device configured to at least one of transmit and receive wireless signals. In an embodiment, the wireless antenna interface 1378 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 1332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1334 includes, but is not limited to, flash memory, phase change memory (PCM), read-only memory (ROM), electrically erasable programmable read-only memory (EEPROM), or any other type of non-volatile memory device.

The memory 1330 stores information and instructions to be executed by the processor 1310. In an embodiment, the memory 1330 may also store temporary variables or other intermediate information while the processor 1310 is executing instructions. In the illustrated embodiment, the chipset 1320 connects with processor 1310 via Point-to-Point (PtP or P-P) interfaces 1317 and 1322. Either of these PtP embodiments may be achieved using a support-structure containing semiconductor package computing system embodiment as set forth in this disclosure. The chipset 1320 enables the processor 1310 to connect to other elements in the support-structure containing semiconductor package embodiments in a system 1300. In an embodiment, interfaces 1317 and 1322 operate in accordance with a PtP communication protocol such as the Intel® QuickPath Interconnect (QPI) or the like. In other embodiments, a different interconnect may be used.

In an embodiment, the chipset 1320 is operable to communicate with the processor 1310, 1305N, the display device 1340, and other devices 1372, 1376, 1374, 1360, 1362, 1364, 1366, 1377, etc. The chipset 1320 may also be coupled to a wireless antenna 1378 to communicate with any device configured to at least do one of transmit and receive wireless signals.

The chipset 1320 connects to the display device 1340 via the interface 1326. The display 1340 may be, for example, a liquid crystal display (LCD), a plasma display, cathode ray tube (CRT) display, or any other form of visual display device. In and embodiment, the processor 1310 and the chipset 1320 are merged into a support-structure containing semiconductor package in a system. Additionally, the chipset 1320 connects to one or more buses 1350 and 1355 that interconnect various elements 1374, 1360, 1362, 1364, and 1366. Buses 1350 and 1355 may be interconnected together via a bus bridge 1372 such as at least one support-structure containing semiconductor package embodiment. In an embodiment, the chipset 1320 couples with a non-volatile memory 1360, a mass storage device(s) 1362, a keyboard/mouse 1364, and a network interface 1366 by way of at least one of the interface 1324 and 1374, the smart TV 1376, and the consumer electronics 1377, etc.

In an embodiment, the mass storage device 1362 includes, but is not limited to, a solid state drive, a hard disk drive, a universal serial bus flash memory drive, or any other form of computer data storage medium. In one embodiment, network interface 1366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 13 are depicted as separate blocks within the support-structure containing semiconductor package embodiment in a computing system 1300, the functions performed by some of these blocks may be integrated within a single semiconductor circuit or may be implemented using two or more separate integrated circuits. For example, although cache memory 1316 is depicted as a separate block within processor 1310, cache memory 1316 (or selected aspects of 1316) can be incorporated into the processor core 1312.

Where useful, the computing system 1300 may have an outer shell. Referring to FIG. 3B, the PCB 350 includes a shell structure 352 that provides both physical and electrical protection for the PWB island-containing semiconductive package 10.

To illustrate the support-structure containing semiconductor package embodiments and assembly methods disclosed herein, a non-limiting list of examples is provided herein:

Example 1 is a semiconductor device package, comprising: a semiconductor package substrate including a die side and a land side: a ball-grid array on the land side, including a cavity region of at least one of an enclave and an exclave in the ball-grid array; at least one device disposed on the land side in the cavity region; and a support structure in the cavity region that contacts the land side and that has a height equivalent to the ball-grid array.

In Example 2, the subject matter of Example 1 optionally includes wherein the cavity region is an enclave, further including: wherein the support structure covers all devices within the cavity region disposed on the land side.

In Example 3, the subject matter of any one or more of Examples 1-2 optionally include wherein the cavity region is an enclave, further including: wherein the support structure forms a cross form factor on the land side, wherein the at least one device includes at least two devices, and wherein one device is covered by the support structure and one device is within the cavity region and not covered by the support structure.

In Example 4, the subject matter of any one or more of Examples 1-3 optionally include wherein the cavity region is an enclave, further including: wherein the support structure forms an X form factor on the land side, wherein the at least one device includes at least three devices, and wherein one device is covered by the support structure, one device is partially covered by the support structure and one device is within the cavity region and not covered by the support structure.

In Example 5, the subject matter of any one or more of Examples 1-4 optionally include wherein the cavity region is an enclave, further including: wherein the support structure forms a Y form factor on the land side, wherein the at least one device includes at least three devices, and wherein one device is covered by the support structure, one device is partially covered by the support structure and one device is within the cavity region and not covered by the support structure.

In Example 6, the subject matter of any one or more of Examples 1-5 optionally include wherein the cavity region is an enclave, further including: wherein the support structure is a plurality of cylinder form factors on the land side and wherein the plurality of support structures is located at the periphery of the cavity region at opposite ends.

In Example 7, the subject matter of any one or more of Examples 1-6 optionally include wherein the cavity region is an enclave, further including: wherein the support structure is a plurality of cylinder form factors on the land side and wherein the plurality of support structures is located around the periphery of the cavity region.

In Example 8, the subject matter of any one or more of Examples 1-7 optionally include wherein the cavity region is an enclave, further including: wherein the support structure is a plurality of cylinder form factors on the land side and wherein the plurality of support structures is located around the periphery of the cavity region; and wherein the plurality of cylinders includes four support structures, one each located at each corner of the package substrate.

In Example 9, the subject matter of any one or more of Examples 1-8 optionally include wherein the cavity region is an enclave, further including: wherein the support structure is a plurality bump-interstitial form factors on the land side, wherein the support structure is enclosed within a plurality electrical bumps.

In Example 10, the subject matter of any one or more of Examples 1-9 optionally include wherein the cavity region is an enclave, further including: wherein the support structure is a plurality bump-interstitial form factors on the land side, wherein the support structure is partially enclosed within a plurality electrical bumps, and also deployed between bumps and the at least one device on the land side.

In Example 11, the subject matter of any one or more of Examples 1-10 optionally include wherein the cavity region is an exclave, further including: wherein the support structure covers all devices within the cavity region disposed on the land side.

In Example 12, the subject matter of any one or more of Examples 1-11 optionally include wherein the cavity region is an exclave, further including: wherein the support structure covers fewer than all devices within the cavity region disposed on the land side.

Example 13 is a method of assembling a semiconductor package comprising: placing cavity support structure on the land side of a semiconductor package substrate, wherein the land side includes a ball-grid array and a cavity formed by the ball-grid array.

In Example 14, the subject matter of Example 13 optionally includes wherein the support structure is flowed onto the land side and cured.

In Example 15, the subject matter of any one or more of Examples 13-14 optionally include wherein the support structure is picked and placed over at least one device disposed on the land side.

In Example 16, the subject matter of any one or more of Examples 13-15 optionally include wherein more than one support structure is placed on the land side.

In Example 17, the subject matter of any one or more of Examples 13-16 optionally include wherein the support structure is placed interstitially among bumps of the ball-grid array.

In Example 18, the subject matter of any one or more of Examples 13-17 optionally include wherein the support structure is placed partially interstitially among bumps of the ball-grid array, and partially between a device on the land side and the ball-grid array.

Example 19 is a computing system, comprising: a semiconductor package substrate including a die side and a land side; at least one active device disposed on the die side including at least one central-processing unit; a ball-grid array on the land side, including a cavity region of at least one of an enclave and an exclave in the ball-grid array; at least one device disposed on the land side in the cavity region; a support structure in the cavity region that contacts the land side and that has a height equivalent to the ball-grid array; a board onto which the ball-grid array is seated, wherein the support structure also contacts the board; and a shell that is part of the board.

In Example 20, the subject matter of Example 19 optionally includes wherein the cavity region is an enclave, further including: wherein the support structure covers all devices within the cavity region disposed on the land side.

In Example 21, the subject matter of any one or more of Examples 19-20 optionally include wherein the cavity region is an enclave, further including: wherein the support structure covers fewer than all devices within the cavity region disposed on the land side.

In Example 22, the subject matter of any one or more of Examples 19-21 optionally include wherein the cavity region is an exclave, further including: wherein the support structure covers all devices within the cavity region disposed on the land side; and wherein the at least one active device is part of a chipset.

In Example 23, the subject matter of any one or more of Examples 19-22 optionally include wherein the cavity region is an exclave, further including: wherein the support structure covers fewer than all devices within the cavity region disposed on the land side; and wherein the at least one active device is part of a chipset.

Example 24 is a semiconductor device package, comprising: a semiconductor package substrate including a die side and a land side: a ball-grid array on the land side, the ball-grid array including a plurality of bumps arranged in a pattern, wherein the pattern includes a region without bumps; at least one device disposed on the land side in the region; and a support structure in the region that contacts the land side and that has a height equivalent to a height of one of the plurality of bumps.

In Example 25, the subject matter of Example 24 optionally includes wherein the region without bumps is an enclave, further including: wherein the support structure covers all devices within the region without bumps disposed on the land side.

In Example 26, the subject matter of any one or more of Examples 24-25 optionally include wherein the region without bumps is an exclave, further including: wherein the support structure covers all devices within the region without bumps disposed on the land side.

In Example 27, the subject matter of any one or more of Examples 24-26 optionally include wherein the region without bumps is an exclave, further including: wherein the support structure covers fewer than all devices within the region without bumps disposed on the land side.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor device package, comprising:
a semiconductor package substrate including a die side and a land side:
a ball-grid array on the land side, including a cavity region of at least one of an enclave and an exclave in the ball-grid array;
at least one device disposed on the land side in the cavity region;
a support structure in the cavity region that contacts the land side and that has a height equivalent to the ball-grid array, wherein the cavity region is an enclave; and
wherein the support structure forms a cross form factor on the land side, wherein the at least one device includes at least two devices, and wherein one device is covered by the support structure and one device is within the cavity region and not covered by the support structure.

2. The semiconductor package of claim 1, further including wherein the support structure also includes a plurality of cylinder form factors on the land side and wherein the plurality of support structures is located at the periphery of the cavity region at opposite ends.

3. The semiconductor package of claim 1, wherein the support structure also includes a plurality of cylinder form factors on the land side and wherein the plurality of support structures is located around the periphery of the cavity region.

4. The semiconductor package of claim 1, further including wherein the support structure also includes a plurality of cylinder form factors on the land side and wherein the plurality of support structures is located around the periphery of the cavity region; and
wherein the plurality of cylinders includes four support structures, one each located at each corner of the package substrate.

5. The semiconductor package of claim 1, further including wherein the support structure also includes a plurality bump-interstitial form factors on the land side, wherein the support structure is enclosed within a plurality electrical bumps.

6. The semiconductor package of claim 1, further including, wherein the support structure also includes a plurality of bump-interstitial form factors on the land side, wherein the support structure is partially enclosed within a plurality electrical bumps, and also deployed between bumps and the at least one device on the land side.

7. A semiconductor device package, comprising:
a semiconductor package substrate including a die side and a land side:
a ball-grid array on the land side, including a cavity region of at least one of an enclave and an exclave in the ball-grid array;
at least one device disposed on the land side in the cavity region;
a support structure in the cavity region that contacts the land side and that has a height equivalent to the ball-grid array, wherein the cavity region is an enclave; and
wherein the support structure forms an X form factor on the land side, wherein the at least one device includes at least three devices, and wherein one device is covered by the support structure, one device is partially covered by the support structure and one device is within the cavity region and not covered by the support structure.

8. The semiconductor package of claim 7, further including wherein the support, structure also includes a plurality of cylinder form factors on the land side and wherein the plurality of support structures is located at the periphery of the cavity region at opposite ends.

9. The semiconductor package of claim 7, wherein the support structure also includes a plurality of cylinder form factors on the land side and wherein the plurality of support structures is located around the periphery of the cavity region.

10. The semiconductor package of claim 7, further including wherein the support structure also includes a plurality of cylinder form factors on the land side and wherein the plurality of support structures is located around the periphery of the cavity region; and
wherein the plurality of cylinders includes four support structures, one each located at each corner of the package substrate.

11. The semiconductor package of claim 7, further including wherein the support structure also includes a plurality bump-interstitial form factors on the land side, wherein the support structure is enclosed within a plurality electrical bumps.

12. The semiconductor package of claim 7, further including, wherein the support structure also includes a plurality of bump-interstitial form factors on the land side, wherein the support structure is partially enclosed within a plurality electrical humps, and also deployed between bumps and the at least one device on the land side.

13. A semiconductor device package, comprising:
a semiconductor package substrate including a die side and a land side:
a ball-grid array on the land side, including a cavity region of at least one of an enclave and an exclave in the ball-grid array;
at least one device disposed on the land side in the cavity region;
a support structure in the cavity region that contacts the land side and that has a height equivalent to the ball-grid array, wherein the cavity region is an enclave; and
wherein the support structure forms a Y form factor on the land side, wherein the at least one device includes at least three devices, and wherein one device is covered by the support structure, one device is partially covered by the support structure and one device is within the cavity region and not covered by the support structure.

14. The semiconductor package of claim 13, further including wherein the support structure also includes a plurality of cylinder form factors on the land side and wherein the plurality of support structures is located at the periphery of the cavity region at opposite ends.

15. The semiconductor package of claim 13, wherein the support structure also includes a plurality of cylinder form factors on the land side and wherein the plurality of support structures is located around the periphery of the cavity region.

16. The semiconductor package of claim 13, further including wherein the support structure also includes a plurality of cylinder form factors on the land side and wherein the plurality of support structures is located around the periphery of the cavity region; and
wherein the plurality of cylinders includes four support structures, one each located at each corner of the package substrate.

17. The semiconductor package of claim 13, further including wherein the support structure also includes a plurality hump-interstitial form factors on the land side, wherein the support structure is enclosed within a plurality electrical bumps.

18. The semiconductor package of claim 13, further including, wherein the support structure also includes a plurality of bump-interstitial form factors on the land side, wherein the support structure is partially enclosed within a plurality electrical humps, and also deployed between bumps and the at least one device on the land side.

* * * * *